(12) United States Patent  
Hsu

(10) Patent No.: US 7,308,066 B2  
(45) Date of Patent: Dec. 11, 2007

(54) CLOCK RECOVERY CIRCUIT CAPABLE OF AUTOMATICALLY ADJUSTING FREQUENCY RANGE OF VCO

(75) Inventor: Tse-Hsiang Hsu, Hsinchu (TW)

(73) Assignee: MediaTek Inc., Hsin Chu (TW)

( * ) Notice: Subject to any disclaimer, the term of this patent is extended or adjusted under 35 U.S.C. 154(b) by 693 days.

(21) Appl. No.: 10/798,387

(22) Filed: Mar. 12, 2004

(65) Prior Publication Data

US 2004/0196941 A1  Oct. 7, 2004

(30) Foreign Application Priority Data

Apr. 4, 2003 (TW) .............................. 92107839 A

(51) Int. Cl.  
*H03D 3/24* (2006.01)
(52) U.S. Cl. ..................................................... 375/376
(58) Field of Classification Search ................ 375/376, 375/373, 375

See application file for complete search history.

(56) References Cited

U.S. PATENT DOCUMENTS

2002/0186804 A1* 12/2002 Dorschky et al. ........... 375/376

* cited by examiner

*Primary Examiner*—Kevin Kim  
(74) *Attorney, Agent, or Firm*—Birch, Stewart, Kolasch & Birch, LLP

(57) ABSTRACT

A clock recovery circuit capable of automatically adjusting the frequency range of a VCO (Voltage controlled Oscillator) without involving a look-up-table. The clock recovery circuit includes a main PLL (Phase locked loop) and an auxiliary PLL. The main PLL is a typical PLL for generating a main oscillation clock. The auxiliary PLL includes an auxiliary frequency detector for receiving the main oscillation clock and an auxiliary oscillation clock and generating an auxiliary frequency error signal, an auxiliary loop filter for receiving the auxiliary frequency error signal and generating a coarse control voltage, and an auxiliary VCO for receiving the coarse control voltage and a reference fine control voltage and generating the auxiliary oscillation clock. The VCO in the main PLL receives the coarse control voltage for setting the frequency range.

8 Claims, 5 Drawing Sheets

| Central frequency of the frequency range of the VCO | RVT |
|---|---|
| FR1 | RVT1 |
| FR2 | RVT2 |
| FR3 | RVT3 |
| FR4 | RVT4 |
| FR5 | RVT5 |
| FR6 | RVT6 |
| FR7 | RVT7 |
| FR8 | RVT8 |
| FR9 | RVT9 |

FIG. 2 (Priort Art)

CLOCK RECOVERY CIRCUIT CAPABLE OF AUTOMATICALLY ADJUSTING FREQUENCY RANGE OF VCO

This Nonprovisional application claims priority under 35 U.S.C. § 119 (a) on patent application Ser. No. 092107839 filed in TAIWAN on Apr. 4, 2003, the entire contents of which are hereby incorporated by reference.

BACKGROUND OF THE INVENTION

1. Field of the Invention

The invention relates to clock recovery circuit, and more particularly to a clock recovery circuit capable of automatically adjusting the frequency range of a VCO (Voltage Controlled Oscillator) in the circuit without needing a look-up-table.

2. Description of the Related Art

Typically, an optical disk drive operates an optical disk at a constant angular velocity, so the linear speeds at the inner tracks and outer tracks of the optical disk are different. In this case, the frequencies of a reference clock to read the EFM (Eight-To-Fourteen Modulation) signal at different tracks for the optical disk drive are also different. In order to correctly read the information on different tracks of the optical disk, the optical disk drive must utilize a clock recovery circuit (or a phase locked loop) to generate a reference clock in synchronization with the EFM signal.

FIG. 1 shows a typical EFM clock recovery circuit. The clock recovery circuit 100 includes a phase detector 101, a frequency detector 102, a charge pump 103 for receiving the output signal PDO of the phase detector 101 and the output signal FDO of the frequency detector 102, a loop filter 104 connected to the charge pump 103, a voltage controlled oscillator (hereinafter referred as VCO) 105 for receiving a fine control voltage VT outputted from the loop filter 104, and a frequency divider 106 for generating the reference clock FCO by dividing the frequency of the oscillation clock outputted from the VCO 105. In the clock recovery circuit 100, the functions of the phase detector 101, the frequency detector 102, the charge pump 103, the loop filter 104, the VCO 105 and the frequency divider 106 are the same as those of the typical phase locked loop, and detailed descriptions thereof will be omitted. In addition to the above-mentioned components, the clock recovery circuit 100 further includes a counter 107 for generating a frequency value of the reference clock FCO, a control unit 108, and a DAC (Digital to Analog Converter) 109. The counter 107 counts the frequency of the reference clock FCO outputted from the frequency divider 106, and generates the frequency value FV to the control unit 108. The control unit 108 chooses a control value from a look-up-table according to the frequency value FV. The DAC 109 converts the control value into an analog coarse control voltage RVT to control the frequency range of the VCO 105.

In this clock recovery circuit 100, however, the control unit 108 thereof has to create a look-up-table, as shown in FIG. 2. That is, the relationship between the central frequency of the frequency range of the VCO (i.e., FRi, i=1~9) and the coarse control voltage RVT has to be determined in advance. Based on the preset look-up-table, a central frequency closest to the reference clock FCO is picked, and the corresponding coarse control voltage in the table is fed to the DAC 109 so as to set the coarse control voltage RVT to adjust the frequency range of the VCO 105.

SUMMARY OF THE INVENTION

It is therefore an object of the invention to provide a clock recovery circuit capable of automatically adjusting frequency range of a VCO without involving a look-up-table.

To achieve the above-mentioned objects, the clock recovery circuit of the present invention includes a phase detector, a main frequency detector, a main loop filter, a main VCO, an auxiliary frequency detector, an auxiliary loop filter, and an auxiliary VCO. The phase detector receives an input signal and a main oscillation clock and generates a phase error signal. The main frequency detector receives the input signal and the main oscillation clock and generates a frequency error signal. The main loop filter receives the phase error signal and the frequency error signal and generates a fine control voltage. The main VCO receives the fine control voltage and a coarse control voltage and generates the main oscillation clock. The auxiliary frequency detector receives the main oscillation clock and an auxiliary oscillation clock and generates an auxiliary frequency error signal. The auxiliary loop filter receives the auxiliary frequency error signal and generates the coarse control voltage. The auxiliary VCO receives the coarse control voltage and a reference fine control voltage and generates the auxiliary oscillation clock.

By using an auxiliary loop in the present invention, the adjustment of the coarse control voltage of the main loop is automatically performed by the auxiliary loop, and need not to involve a look-up-table.

BRIEF DESCRIPTION OF THE DRAWINGS

FIG. 2 illustrates a look-up-table for the clock recovery circuit of FIG. 1.

DETAILED DESCRIPTION OF THE INVENTION

The clock recovery circuit of the invention will be described with reference to the accompanying drawings.

Figure 1:
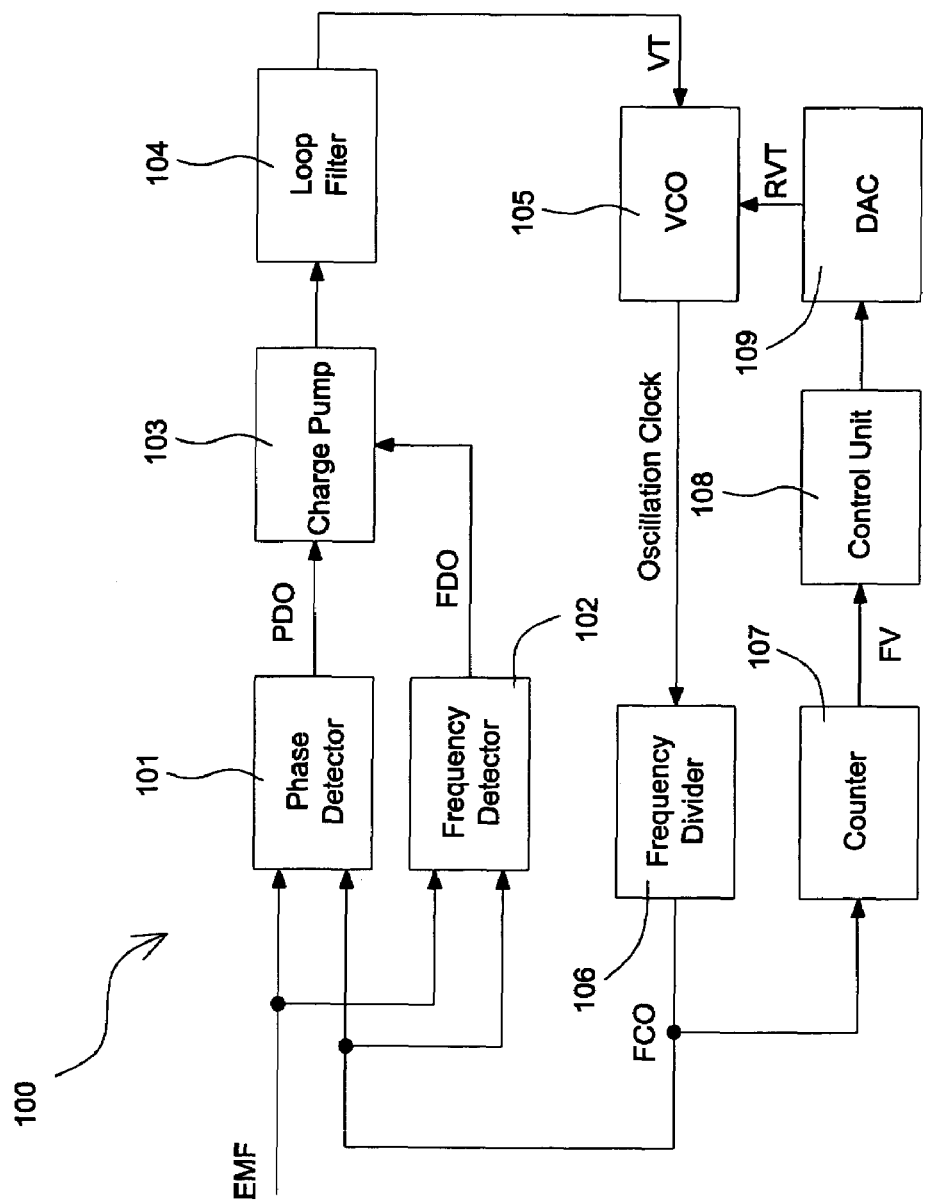
FIG. 1 illustrates a typical EFM clock recovery circuit.
Figure 3A:
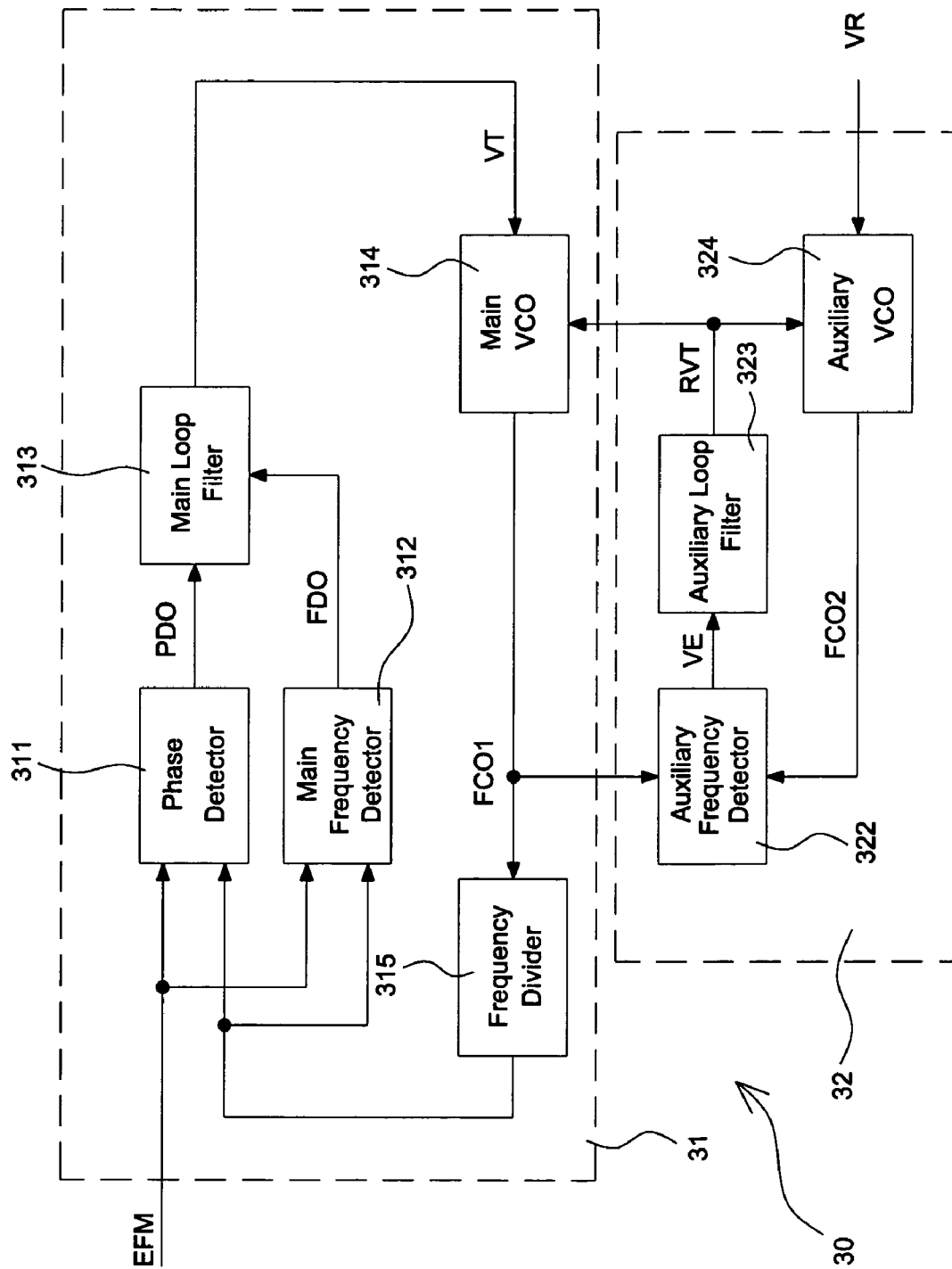
FIG. 3A illustrates a block diagram of a clock recovery circuit of the invention.
Figure 3B:
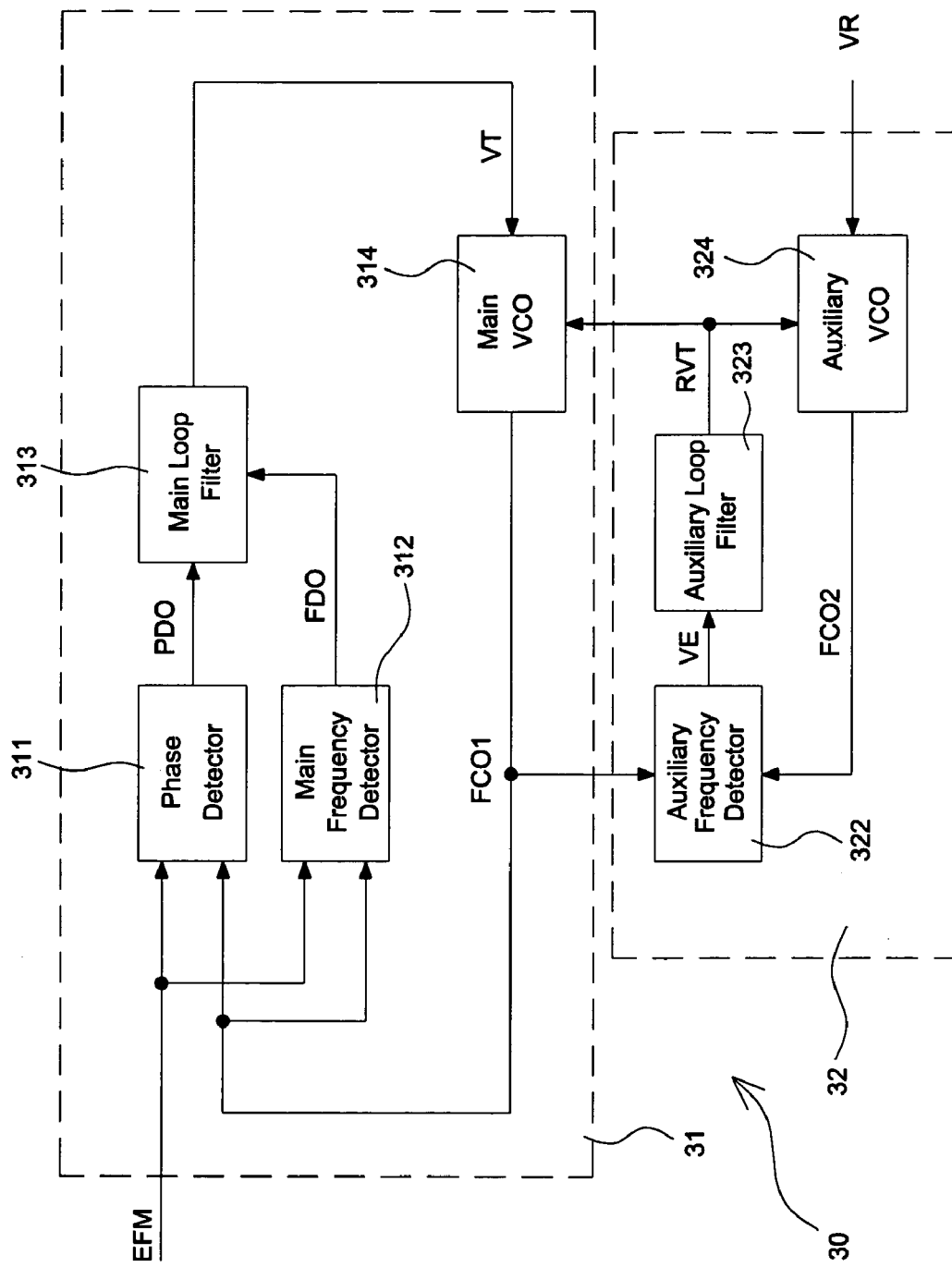
FIG. 3B illustrates another block diagram of a clock recovery circuit of the invention.

FIG. 3A illustrates a block diagram of a clock recovery circuit of the invention, which is capable of automatically adjusting the frequency range of a VCO. Referring to FIG. 3A, the clock recovery circuit 30 includes a main loop 31 and an auxiliary loop 32. The main loop 31 includes a phase detector 311, a main frequency detector 312, a main loop filter 313 connected to the phase detector 311 and the main frequency detector 312, a main VCO 314 for receiving a fine control voltage VT of the main loop filter 313, and a frequency divider 315. The main loop 31 is a typical phase locked loop (PLL), so the function and architecture of each unit will not be described again. Note that the frequency divider 315 also may be omitted, as shown in FIG. 3B.

The auxiliary loop 32 includes an auxiliary frequency detector 322, an auxiliary loop filter 323, and an auxiliary VCO 324. The auxiliary frequency detector 322 receives a main oscillation clock FCO1 generated by the main VCO 314 and an auxiliary oscillation clock FCO2 generated by the auxiliary VCO 325, and then outputs a frequency error value VE. The auxiliary loop filter 323 receives the frequency error value VE, filters the frequency error value VE, and then generates a coarse control voltage RVT. Finally, the auxiliary VCO 324 sets the frequency range according to the coarse control voltage RVT, and generates the auxiliary oscillation clock FCO2 according to a reference fine control voltage VR. The main VCO 314 utilizes the coarse control voltage RVT to set its frequency range, and utilizes the fine control voltage VT outputted from the main loop filter 313 to adjust the frequency of the main oscillation clock FCO1.

In general, the frequency $f_{FCO}$ of the oscillation clock of a VCO is known to be:

$$f_{FCO} = k1*V1 + k2*V2 \qquad (1),$$

wherein k1 and k2 are design parameters of the VCO, k2 is larger than k1, V2 is the coarse control voltage for adjusting the frequency range of the oscillation clock of a VCO, and V1 is the fine control voltage for controlling the frequency of the oscillation clock of a VCO. Therefore, if the design parameters of the main VCO 314 and the auxiliary VCO 324 are the same, the frequencies of the main oscillation clock FCO1 of the main VCO 314 and the auxiliary oscillation clock FCO2 of the auxiliary VCO 324 are:

$$f_{FCO1} = k1*VT + k2*RVT \qquad (2), \text{ and}$$

$$f_{FCO2} = k1*VR + k2*RVT \qquad (3).$$

where $f_{FCO1}$ and $f_{FCO2}$ denotes the frequencies of the main oscillation clock FCO1 and that of the auxiliary oscillation clock FCO2, respectively.

As mentioned, the coarse control voltage RVT is generated by the auxiliary loop 32. So, when the main oscillation clock FCO1 and the auxiliary oscillation clock FCO2 have different frequencies, the coarse control voltage RVT will be changed therewith. The control principle of the invention will be described in the following.

First, once in the steady state, the main oscillation clock FCO1 will synchronize to the input signal EFM, and the auxiliary oscillation clock FCO2 will synchronize to the main oscillation clock FCO1. In other words, the frequency of the main oscillation clock FCO1 will equal to that of the input signal EFM, and the frequency of the auxiliary oscillation clock FCO2 will equal to that of the main oscillation clock FCO1.

When the frequency of the input signal EFM increases, the fine control voltage VT will increase correspondingly, so that the frequency of the main oscillation clock FCO1 can be in synchronization with the frequency of the input signal EFM. At the meantime, because the frequency of the main oscillation clock FCO1 becomes higher than that of the auxiliary oscillation clock FCO2, the coarse control voltage RVT will be risen correspondingly. In the condition when the coarse control voltage RVT is risen, the frequency of the main oscillation clock FCO1 is forced to be higher than that of the input signal EFM, and the fine control voltage VT is reduced so as to prevent the too-high fine control voltage VT from saturating the main VCO 314. On the other hand, the frequency of the auxiliary oscillation clock FCO2 also rises to follow the frequency of the main oscillation clock FCO1. Therefore, when the system reaches the steady state, the main oscillation clock FCO1 will be eventually in synchronization with the input signal EFM again, and the frequency of the auxiliary oscillation clock FCO2 will be equal to that of the main oscillation clock FCO1. Meanwhile, the fine control voltage VT will be equal to the reference fine control voltage VR. Consequently, the fine control voltage VT is controlled at a proper position without the risk of causing the saturation of the main VCO 314 as long as the reference fine control voltage VR is properly set. Furthermore, a good linear operation range of the main VCO 314 is provided.

Next, when the frequency of the input signal EFM is reduced, the fine control voltage VT will be reduced correspondingly such that the frequency of the main oscillation clock FCO1 can be in synchronization with the frequency of the input signal EFM. At this time, because the frequency of the main oscillation clock FCO1 becomes lower than that of the auxiliary oscillation clock FCO2, the coarse control voltage RVT is also reduced therewith. In the condition when the coarse control voltage RVT is reduced, the frequency of the main oscillation clock FCO1 is forced to be lower than that of the input signal EFM, and the fine control voltage VT is risen so as to prevent the too-low fine control voltage VT from saturating the main VCO 314. On the other hand, the frequency of the auxiliary oscillation clock FCO2 also reduces to follow the frequency of the main oscillation clock FCO1. Therefore, when the system reaches the steady state, the main oscillation clock FCO1 will be eventually in synchronization with the input signal EFM, and the frequency of the auxiliary oscillation clock FCO2 will be equal to that of the main oscillation clock FCO1. Meanwhile, the fine control voltage VT will be equal to the reference fine control voltage VR. Consequently, the fine control voltage VT is controlled at a proper position without risk of causing the saturation of the main VCO 314 as long as the reference fine control voltage VR is properly set. Furthermore, a good linear operation range of the main VCO 314 is provided.

Figure 4:
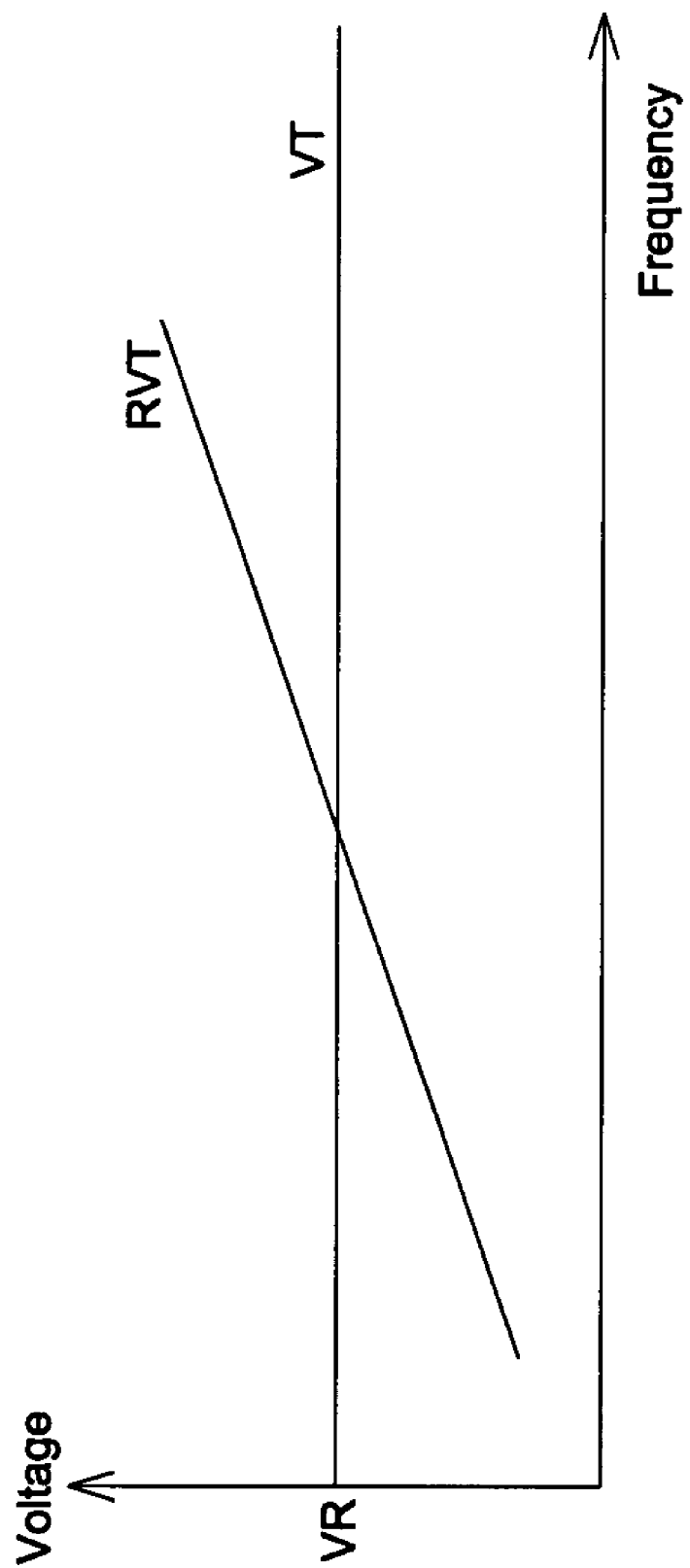
FIG. 4 illustrates the relation curve of the fine control voltage VT and the coarse control voltage RVT versus the frequency of the input signal EFM.

FIG. 4 illustrates the relation curve of the fine control voltage VT and the coarse control voltage RVT versus the frequency of the input signal EFM, according to the present invention. As shown in FIG. 4, when the frequency of the EFM signal changes from low to high, the coarse control voltage RVT also increases therewith such that the fine control voltage VT of the main VCO 314 is held at a preset constant value VR. Consequently, the fine control voltage VT of the main VCO 314 will never be saturated and the main VCO 314 will operate in the linear zone as long as the reference fine control voltage VR is selected to be a proper voltage value.

Hence, the clock recovery circuit of the invention utilizes an auxiliary loop to automatically adjust the coarse control voltage of the VCO of the main loop. So, it is possible to effectively prevent the VCO from reaching the saturation state without preparing a look-up-table previously.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. A clock recovery circuit, which is capable of automatically adjusting frequency range of a VCO in the clock recovery circuit, the clock recovery circuit comprising:
   a main VCO for generating a main oscillation clock;
   a phase detector for receiving an input signal and the main oscillation clock and generating a phase error signal;
   a main loop filter for receiving the phase error signal and generating a fine control voltage;
   an auxiliary VCO for generating an auxiliary oscillation clock;

an auxiliary frequency detector for receiving the main oscillation clock and the auxiliary oscillation clock and generating an auxiliary frequency error signal; and an auxiliary loop filter for receiving the auxiliary frequency error signal and generating a coarse control voltage;

wherein the main VCO generates the main oscillation clock according to the fine control voltage and the coarse control voltage, and the auxiliary VCO generates the auxiliary oscillation clock according to a reference fine control voltage and the coarse control voltage.

2. The clock recovery circuit according to claim 1, wherein the coarse control voltage is used to set the frequency range of the main VCO.

3. The clock recovery circuit according to claim 2, wherein the coarse control voltage is used to set the frequency range of the auxiliary VCO.

4. The clock recovery circuit according to claim 1, further comprising a main frequency detector for receiving the input signal and the main oscillation clock and generating a main frequency error signal.

5. The clock recovery circuit according to claim 4, wherein the main loop filter further receives the main frequency error signal as a reference for generating the fine control voltage.

6. The clock recovery circuit according to claim 1, further comprising a frequency divider, which is arranged after the main VCO, for dividing the frequency of the main oscillation clock.

7. The clock recovery circuit according to claim 1, wherein the main VCO and the auxiliary VCO have the same design parameters.

8. The clock recovery circuit according to claim 1, wherein the clock recovery circuit is applied to a control circuit of an optical disk drive.

* * * * *